(12) United States Patent
Meyer et al.

(10) Patent No.: US 6,593,249 B2
(45) Date of Patent: Jul. 15, 2003

(54) METHOD FOR FORMING A METAL PATTERN ON A DIELECTRIC SUBSTRATE

(75) Inventors: Heinrich Meyer, Berlin (DE); Udo Grieser, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/852,384

(22) Filed: May 10, 2001

(65) Prior Publication Data

US 2003/0036288 A1 Feb. 20, 2003

(30) Foreign Application Priority Data

Mar. 7, 2001 (DE) .......................... 101 12 023

(51) Int. Cl.$^7$ .................... H01L 21/31; H01L 21/302
(52) U.S. Cl. .................... 438/759; 438/690; 438/758; 438/778; 438/780
(58) Field of Search .................... 438/109, 584, 438/689, 690, 758, 759, 778, 780; 257/678, 684–686, 687, 712, 714

(56) References Cited

U.S. PATENT DOCUMENTS

| | | | |
|---|---|---|---|
| 3,755,119 A | * 8/1973 | Pietsch ...................... 204/181 |
| 4,345,969 A | * 8/1982 | James et al. ............. 156/659.1 |
| 4,592,816 A | * 6/1986 | Emmons et al. ......... 204/180.6 |
| 4,708,925 A | * 11/1987 | Newman .................... 430/270 |
| 4,845,012 A | 7/1989 | Seko et al. |
| 4,871,591 A | 10/1989 | Sugimura et al. |
| 5,080,998 A | 1/1992 | Irving et al. |
| 5,211,805 A | * 5/1993 | Srinivasan .................. 156/643 |
| 5,576,073 A | 11/1996 | Kickelhain |
| 5,667,541 A | * 9/1997 | Klun et al. .................... 51/298 |
| 5,954,890 A | * 9/1999 | Smith et al. .................. 134/38 |
| 6,156,445 A | 12/2000 | Burns et al. |

FOREIGN PATENT DOCUMENTS

| | | |
|---|---|---|
| DE | 0S 1 811 377 | 6/1970 |
| DE | 37 32 249 A1 | 4/1989 |
| DE | 41 31 065 A1 | 3/1993 |
| DE | 44 17 245 | 10/1995 |
| EP | 0 062 300 A2 | 10/1982 |
| EP | 0 469 635 A1 | 9/1989 |
| EP | 0 489 560 A1 | 12/1991 |
| EP | 0 587 038 A 1 | 3/1994 |
| EP | 0 757 885 B1 | 4/1995 |
| JP | 59 227 186 A | 12/1984 |
| WO | WO 95/29573 | 11/1995 |

OTHER PUBLICATIONS

Database WPI, Section Ch, Week 199301, Derwent Publications Ltd., London, GB; AN 1993–003099, XP002206532 and JP04329543 A (Toa Gosei Chem Ind Ltd.), Nov. 18, 1992 abstract.

* cited by examiner

Primary Examiner—Ernest Karlsen
Assistant Examiner—Scott B. Geyer
(74) Attorney, Agent, or Firm—Paul & Paul

(57) ABSTRACT

A method of reproducibly manufacturing circuit carriers with very fine circuit structures, more specifically with structure widths of 50 μm and less, is described in which a substrate provided with a base metal surface is provided, a layer of varnish is applied onto the substrate by an electrophoretic method, the layer of varnish is ablated in at least parts of the regions that do not correspond to the metal pattern to be formed, the base metal surface being laid bare, the bare base metal surface is etched, the layer of varnish being ablated by means of ultraviolet irradiation, more specifically with an ultraviolet laser beam.

37 Claims, 4 Drawing Sheets

METHOD FOR FORMING A METAL PATTERN ON A DIELECTRIC SUBSTRATE

BACKGROUND OF THE INVENTION

1. Field of the Invention

The invention relates to a method of forming a metal pattern on a dielectric substrate coated with a layer of metal, preferably with a copper film.

2. Brief Description of the Related Art

In the past, many different methods of producing circuit patterns on electric circuit carriers have been proposed. In the panel plating process, a layer of copper that completely covers the drilled printed circuit board material is first produced in the thickness required for the circuit structures. Then, those regions of the outer sides of the printed circuit boards are covered with a layer of resist that correspond to the circuit structures to be formed so that these regions are protected during the subsequent etching process, thus being preserved. In the pattern plating process but a thin copper film is at first formed on the printed circuit board material. A layer of photoresist is for example applied there onto and the copper film is led bare again by photostructuring at the places that correspond to the circuit structures to be formed. A layer of galvanoresist is applied to the bare copper regions. Then, the layer of photoresist is removed and the bare copper film is removed by etching, the layer of galvanoresist protecting the layer of metal located underneath against the etching agent. In the subcase of the metal resist process, a layer of metal resist, a layer of terne metal for example, is applied as a galvanoresist layer.

These methods and other known methods present considerable disadvantages. More specifically, it is not possible to manufacture under manufacturing conditions circuit structures of widths of less than 100 μm in a reproducible way. Numerous attempts have been made to achieve this goal. With the help of some complicated methods and basic materials, such circuits could finally be produced. Such methods however are not suited for mass production since they are too expensive and complex and/or require very expensive basic materials. These methods are not suited to produce circuits with lines having a structure width of less than 50 micrometers though.

DE-A-18 113 77 discloses a method of manufacturing printed circuit boards with circuit lines applied on both sides thereof, in which an etch resist layer, more specifically a layer of tin, is exclusively applied to the copper film in the bores of the printed circuit boards that have been contacted through and in which the desired delineation pattern is made by etching. For this purpose, the outer sides of the boards are provided with a layer of varnish extending as far as the brinks of the bores prior to applying the etch resist layer.

DE 37 32 249 A1 indicates a method of manufacturing three-dimensional printed circuit boards in subtractive/semi-additive technique with image transmission on an insulating substrate in which the substrate coated with a copper film is at first coated all over with a tin metal resist that may be electroless plated and/or electrolytically deposited and the metal resist is then selectively exposed to laser irradiation without using a mask so that the circuit pattern created is a negative. The copper regions that have been laid bare may then be removed by etching.

EP 0 062 300 A2 also describes a method of producing printed circuit boards in which one copper film is applied on at least one side of a plastic substrate, the circuit pattern being then formed in the copper film in that a metallic etch resist layer is deposited onto the copper film, the etch resist layer being selectively evaporated according to the desired circuit pattern by means of a laser beam and the remaining copper film being removed by etching as far as the surface of the plastic substrate at the places removed by way of the laser treatment.

In Derwent Abstracts to JP-A-59227186 a method is outlined in which a photoresist is applied to the outer sides only of a printed circuit board that has been contacted through, then a metallic layer of etch resist, among others of solder metal or tin, is deposited on the walls of the bores, whereupon the photoresist with the delineation pattern is exposed to light and developed prior to finally removing by etching the copper that has been laid bare.

EP 0 757 885 B1 indicates a method of forming metallic circuit patterns on electrically isolating substrates in which at first a layer of metal is applied to the substrate prior to applying thereupon an organic protective layer with an electrophoretic dip coat. Then. , the protective layer is removed in the regions of the circuit patterns to be formed by means of laser irradiation. An etch resistant layer of metal is deposited onto the metal surface that has been laid bare. Then, the organic protective layer is cleared off in the regions adjacent the future circuit pattern by means of laser irradiation and the layer of metal that has been laid bare is also removed in these regions by means of an etching process. Laser irradiation is generated by an Nd-YAG-laser.

DE 41 31 065 A1 discloses still another method of manufacturing printed circuit boards, in which at first a layer of metal and then a metallic or an organic layer of etch resist is applied onto a substrate. It suggests using as a metallic layer of etch resist a layer of an alloy of tin or of terne metal and as an organic layer of etch resist a layer that may be produced by electrophoretic enameling or electrostatic coating. In the regions directly adjacent the future circuit pattern, the layer of etch resist is then removed by etching by means of electromagnetic irradiation, by means of laser irradiation for example, in such a way that the circuit pattern and islands of the layer of metal that are electrically isolated from the pattern by etching grooves remain on the substrate. Laser irradiation is generated by an Nd-YAG-laser. The document indicates that etching grooves of 150 μm width are produced with this method, the undercut of the layers of metal on each flank of the etching grooves amounting to 35 μm.

EP 0 469 635 A1 also describes a method of producing printed circuit boards in which a layer of metal and then an organic layer of etch resist are applied onto a substrate. The organic etch resist layer used is an electrophoretic dip coating. Subsequently, the layer of etch resist in the regions directly adjacent the future circuit pattern is cleared off by way of an Nd-YAG-laser and the thus laid bare layer of metal is removed by etching.

EP 0 489 560 A1 describes a composition of resin for forming a positive photoresist which is used as an anaphoretic varnish for manufacturing printed circuit boards. The resin composition is obtained by copolymerization of the following compounds: a) acrylic acid and methacrylic acid, b) compounds that are unstable in acids, for example tert.-butyl acrylate and tert.-butyl methacrylate and also c) a polymerizable monomer with which a homopolymer can be obtained that has a glass transition temperature $T_g$ of 0° C. or less, e.g. ethyl acrylate, iso-propyl acrylate, n-propyl acrylate, iso-butyl acrylate, 2-ethyl hexyl acrylate, n-hexyl methacrylate, n-octyl methacrylate and n-decyl methacrylate. The resist also contains a photoacid generator, e.g. a phosphonium, sulphonium, diazonium and iodonium salt. For structuring, the resist is exposed to light and developed, the regions being altered by the exposure in such a way that they are soluble in the processing solution.

The known methods either are extremely sophisticated and thus expensive or it is not possible to manufacture very fine structures with a width of 50 μm and less in a reproducible way. The only known possibility to produce such fine structures consists in starting from a material being provided with a copper film of no more than 5 μm thick. But it is extraordinarily complicated and thus expensive to manufacture such materials with this process. In using the customary materials with a thick copper film (usually 17 μm), it has been found that, on account of considerable undercut, the circuit structures often have no rectangular section, so that the area with which they rest on the substrate is very small, the desired adhesion of the circuit lines being not achieved as a result thereof.

In using the method described in DE 37 32 249 A1, it has been found that, even after laser ablation, considerable amounts of tin are still to be found on those regions of the copper surfaces that have previously been freed from tin so that the subsequent etching result obtained is not satisfactory. More specifically when manufacturing circuit carriers with circuit lines having structure widths of less than 50 μm, no reproducible results may be obtained. The shape and width of the circuit lines varies over wide limits. In parts, either the spaces between the circuit lines are interconnected or the circuit lines are disrupted. Sometimes, pitting-like etchings of the circuit pattern were observed after the copper film had been removed by etching.

Additionally, the circuit patterns produced with this method often create problems in subsequent processes, when a solder resist mask is being formed for example, and in processes in which the end layers deposited are layer combinations of nickel/gold. In the first case, the adhesion of the mask to the circuit structures is not sufficient and in the second case, the copper structures that have been freed from the layer of tin cannot perfectly be etched to form the layer of nickel/gold.

The methods in which an etch resist layer is made with an electro dip coat and in which said layer is structured with an Nd-YAG-laser by selectively allowing the layer of varnish to evaporate, also present difficulties, since in this case too, unreproducible residues are formed that may deposit again onto the already laid bare metal surfaces. If, for structuring metallic layers, a conventional method is utilized in which photosensitive layers are deposited onto the metallic surface, an additional step in development is necessary. Moreover, these resists and the substrates coated with said resists are difficult to manipulate because it is not evident to use them in daylight. It has been found that the known electrophoretic photoresist systems do not readily permit error-free resolution of finest structures.

SUMMARY OF THE INVENTION

The basic problem of the present invention is therefore avoiding the disadvantages of the known methods and finding more specifically a method that makes it possible to readily and, most of all, very quickly, carry out structuring which may also be performed in mass production and that permits to reproducibly manufacture finest structures with structure widths of 50 μm and less. Furthermore, the problems experienced with the known methods with regard to the capability of further processing the finished circuit patterns are not to occur. The shape of the circuit lines too is to be reproducible and is to come the nearest possible to a rectangular section.

The problem is solved by the method according to claim 1. Preferred embodiments of the invention are indicated in the subordinate claims.

DETAILED DESCRIPTION OF THE PREFERRED EMBODIMENTS

Figure 1:
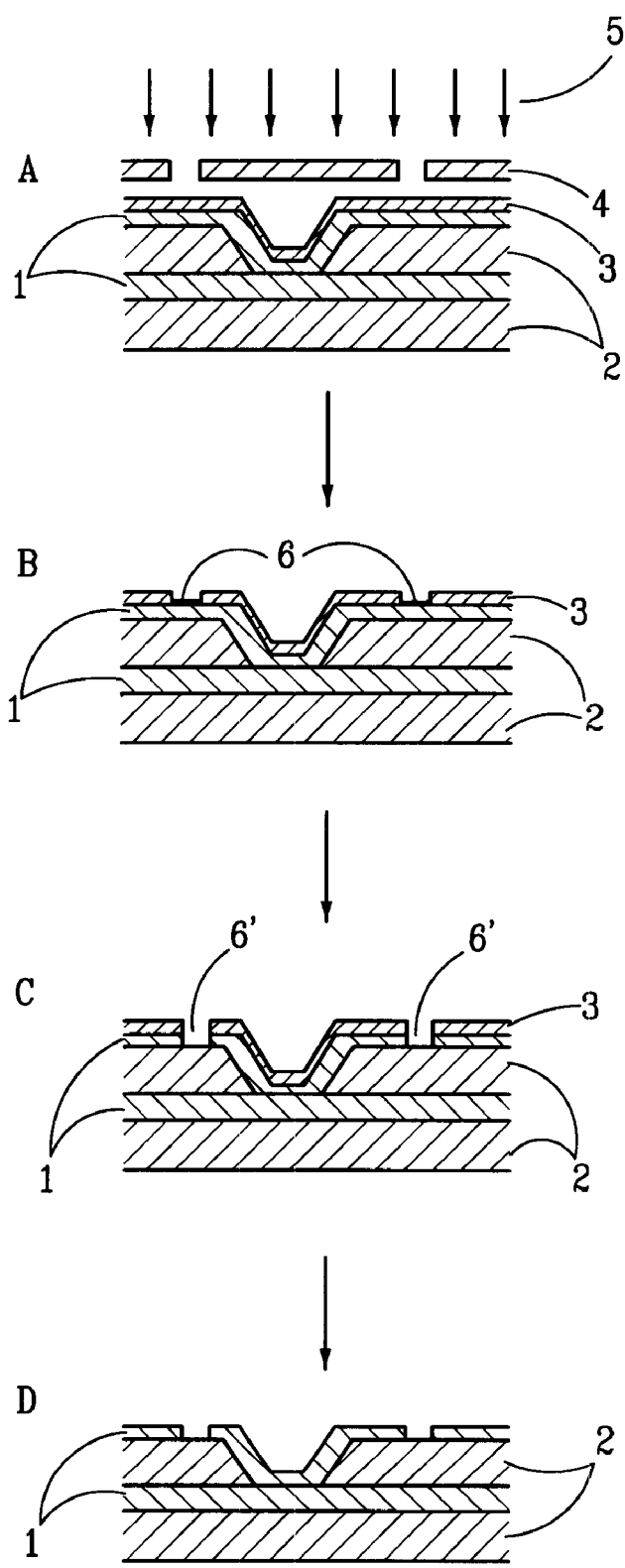
FIG. 1 is a schematic illustration of steps A through D of the method according to the invention.

The method according to the invention serves to form a metallic pattern on dielectric substrates.

The method is more specifically used to produce highly integrated circuit carriers for the microelectronics industry, e.g. chip carriers, multichip modules (MCM) and other hybrid circuit carriers. Of course, the method may also be used for manufacturing other products, e.g. for manufacturing printed circuit boards (PCB) with structure widths in excess of 50 μm, of micro reactors, storage media, solar collectors, and for forming metal patterns on plastics for decorative effect.

For carrying out the method according to the invention, a substrate provided with a base metal surface, preferably with a copper film, is used and the base metal surface is etched upon structuring according to the invention so that the desired metal pattern is created. If a base metal layer is used, said layer may be completely cleared off upon structuring in the regions that have been laid bare. The following process stages are performed to structure the base metal surface:

b) applying a layer of varnish to the substrate by means of an electrophoretic process, c) ablating the layer of varnish with ultraviolet irradiation (≦450 nm) in at least parts of the regions that do not correspond to the metal pattern to be formed, the base metal surface being laid bare (the lower wavelength limit of the ultraviolet irradiation being among others determined by whether the exposure to light is carried out in air (≧190 nm) or under vacuum, whereas in the latter case an irradiation with a wavelength of below 190 nm may also be used);

d) etching of the base metal surface laid bare.

The layer of varnish may for example be completely cleared off in the regions that do not correspond to the metal pattern to be formed. In another embodiment, the layer of varnish is only removed in parts of these regions, e.g. only in those regions that are immediately adjacent the metal patterns to be formed, so that large areas of metal remain between the discrete areas of the metal pattern to be formed (cf. in this regard DE 41 31 056 A1, EP 0 469 635 A1 and EP 0 361 192 A2 for example). The advantage of this way of proceeding is that in cases in which the metal pattern only incompletely or unevenly fills the surface of the substrate, so that large regions are left unaffected by the pattern, the layer of varnish can be removed much faster from the surface of the substrate than in cases in which the layer of varnish is to be completely cleared off in the whole region in which metal patterns are not to be formed.

The energy irradiation preferably used is laser irradiation because this radiation is provided with a sufficiently high energy density and can moreover be sharply focused in order to be capable of manufacturing the fine structures and more specifically because in the focused laser beam an energy density is achieved that is sufficiently high to ablate a layer of varnish. The surface regions in which the layer of varnish is to be removed and which are to be exposed to light are scanned in this latter case so that the surface regions are one after the other captured by the beam.

It is of course also possible not to focus the laser beam so that the entire surface of the substrate for example is simultaneously exposed to light. In this case, a mask is used (either in contact with the substrate or without contact by way of an optical system) to shield the surface regions in which the metal patterns are to be formed so that, in these regions, the layer of varnish is protected from the laser beam.

To selectively remove the layer of varnish in the regions of the base metal surface that are to be laid bare, an excimer laser is preferably used, e.g. an ArF—, KrCl—, KrF—, XeCl—, XeF— or an $F_2$ laser with a constant output of 300 watts for example. This radiative source is particularly suited to ablate layers of varnish consisting of organic material without leaving any residue since the chemical bonds in the organic molecules of the layer of varnish can be broken by means of the ultraviolet irradiation.

When using an excimer laser, the energy density at the location of treatment preferably amounts to at least 50 $mJ/cm^2$. On principle, lower energy densities may be adjusted though, when the speed at which the laser is scanned across the board is reduced or when exposure time is accordingly prolonged when at the same time the entire surface of the substrate is exposed to a non focused laser beam.

The method according to the invention permits to form circuit patterns in which the circuit lines have structure widths of 50 $\mu$m and less. Circuit lines may for example be formed which have an almost rectangular section with a base width of 15 $\mu$m. The section of the circuit line is substantially shaped like a trapezoid and it has been found that the base area of the circuit lines abutting the dielectric is wider than the surface. As a result, a large area of contact between the circuit lines and the dielectric is obtained and optimal adhesion to the substrate is accordingly achieved. With circuit lines of about 20 $\mu$m wide and about 20 $\mu$m high, the steepness of the flanks of the circuit lines, called undercut, amounts to approximately 2.5 $\mu$m. This signifies that the base area on each flank of the circuit lines protrudes by the indicated distance from under the surface of the circuit lines.

The width of the circuit lines can be set to be reproducible. Circuit lines with a substantially constant structure width of about 20 $\mu$m may for example be obtained. Variation in width lies within the range of approximately ±1 $\mu$m. The electric integrity of the entire electric circuit is thus secured.

More specifically, the problems that have been observed with the method described in DE 37 32 249 A1 do not occur. Failures in the subsequent etching of the copper layer laid bare have not been observed. All of the surface regions of the circuit to be processed, in which the layer of varnish is removed after the surface regions corresponding to the circuit lines have been treated by laser and after a protective coating for etching made from metal has subsequently been deposited in these regions, may be etched without problem and without leaving residues.

Pitting-like etchings in the metal pattern have not been observed even after the copper layer has been etched.

Moreover, there exists no problem of further processing the etched circuit carriers: In contrast to the known methods, the application of a solder resist mask and a subsequent deposition of an end layer of nickel/gold do not present any difficulties. In the first case, the adhesion of the solder resist mask to the circuit lines is good enough, in the second case, the surfaces of the circuit lines can be satisfactorily etched prior to applying the end layer.

The method of ablating by means of an energy radiation source according to the invention is of greater ease as compared to the conventional structure techniques using photoresists and screen printing resists. The layer of varnish in particular requires no further chemical development. Additionally, a maximum flexibility of the structuring process is achieved since it may be carried out without masks.

As contrasted with radiative sources emitting in the visible, more specifically in the red or infrared region of the spectrum, (such methods are described in EP 0 062 300 A2, DE 41 31 065 A1, EP 0 757 885 B1 and EP 0 469 635 A1), the ultraviolet radiative sources used according to the present invention are particularly suited to form finest metal patterns, more specifically with structure widths of 50 $\mu$m and less. This is made possible by the fact that the layer of varnish may be cleared off the underlying base metal surface a. readily b. without residues c. leaving sharp contours d. that the base metal layer may be removed in the laid bare regions without substantial undercut after the layer of varnish has been readily cleared off without residues and leaving sharp contours.

It has been found that on using radiative sources in the (visible and infrared region) of longer wavelength, ablation of the layer of varnish is not secure and can more particularly not be carried out leaving sharp contours. On the contrary, the structured layer of varnish often shows flanks with unsharp contours. Moreover, in these cases, residues remain in the channels formed on the base metal area. The reason therefore may be that removal of the layer of varnish with the electromagnetic irradiation in the visible and infrared region is thermal (pyrolytic) and not substantially photolytic as it is the case when using ultraviolet irradiation. In the process, reaction products from the layer of varnish are formed in an undefined way, these reaction products may in parts be of high molecular weight so that removal of the layer of varnish is incomplete on account of its low vapor pressure.

Excimer lasers are particularly well suited to generate irradiation in the ultraviolet range of the spectrum, because they permit to attain a high radiation density in this wavelength range. The processing time needed for selectively removing the layer of varnish is considerably reduced as a result thereof so that the throughput of a processing plant provided with such facilities is high enough and the cost for carrying out this method is sufficiently low.

The method according to the invention has further advantages over the known methods:

a) in the process of etching used to structure the base metal surface, protection of the bores in the substrates is effective so that a dependable resistance to etching is guaranteed and layers of metal in these areas are not affected; the same is true for the layer of varnish remaining over the metal patterns on the surfaces of the substrates;

b) the substrates covered with the layer of varnish are mechanically insensitive since after having been submitted to drying and if need be to a heat treatment, the layer of varnish is scratch resistant and more specifically resistant to fingerprints;

c) the varnish is not photosensitive and is accordingly easier to handle than conventional photoresists;

d) moreover, the layer of varnish may readily be removed.

An anaphoretic varnish is preferably used to form the layer of varnish. Such varnishes are readily removable by means of alkaline solutions.

The copolymer is to have the following properties:

a) good adhesion to the base metal surfaces, more specifically to the copper surfaces;

b) good resistance to acid copper etchants, to a hydrochloric acid $FeCl_3$ solution for example;

c) it is to be easily removable from the base metal surfaces and is not to leave any residues behind when irradiated with ultraviolet radiation;

d) it is to be easily removable from the base metal surfaces with an aqueous, alkaline solution upon etching the base metal layers (2 percent by weight NaOH solution);

e) good emulsifying power in aqueous solvents for use as an anaphoretic varnish;

f) low glass transition temperature $T_g$ below 100° C. in order to guarantee thermosetting even for sensitive substrates.

For an optimum varnish formed with the copolymers, a compromise has to be found between the need for sufficient thickness required for making sure of sufficient resistance to etching and minimum thickness for guaranteeing fast ablation rates with ultraviolet irradiation.

For this purpose, the varnish is preferably made of at least one copolymer formed by the copolymerization of monomers selected from the group comprising methacrylic acid, $C_1$ to $C_2$ alkyl methacrylate, $C_3$ to $C_{10}$ alkyl (meth)acrylate and hydroxy alkyl methacrylate, the alkyl groups of which have two to four atoms of carbon. The term alkyl (meth) acrylate designates both the alkyl acrylates and the alkyl methacrylates.

To form the copolymer, methyl methacrylate is more specifically used as the $C_1$ to $C_2$ alkyl methacrylate, butyl acrylate as the $C_3$ to $C_{10}$ alkyl acrylate and 1-hydroxy ethyl methacrylate, 2-hydroxy ethyl methacrylate or the corresponding hydroxy propyl acrylates are used as the of hydroxy alkyl methacrylate.

To produce the copolymer, the monomers are preferably used in the following amounts:

a) methacrylic acid: 1 to 25 percent by weight b) $C_1$ to $C_2$ alkyl methacrylate: 20 to 80 percent by weight c) $C_3$ to $C_{10}$ alkyl acrylate: 1 to 50 percent by weight d) hydroxy alkyl methacrylate: 0 to 20 percent by weight, the sum of the amounts of the above mentioned monomers amounting to a total of 100 percent by weight.

If a $C_3$ to $C_{10}$ alkyl methacrylate is used instead of a $C_3$ to $C_{10}$ alkyl acrylate, this monomer is to be used in a considerably higher concentration, e.g. in a concentration of 25 to 75 percent by weight. Such an increase reduces by the same amount the content of $C_1$ to $C_2$ alkyl methacrylate, e.g. to a proportion of 5 to 40 percent by weight.

The copolymer contains methacrylic acid to optimize the adhesion of the layer of varnish to the base metal surface and to guarantee sufficient emulsifying power of the copolymer in aqueous alkaline solvents. If its share in the copolymer is too low, adhesion is too low. On the other side, too high a proportion is also to be avoided to make certain that the layer of varnish may be completely (without leaving any residue) cleared off when ablated by laser and more specifically when the layer with the base metal surface is subsequently removed with an alkaline aqueous solution.

The copolymer contains methyl and/or ethyl methacrylate to adjust the mechanical properties, more specifically to adapt the stiffness of the copolymer to the practical requirements. If its share is too high, the copolymer embrittles and can fracture when heat treated. Moreover, the manipulation of such layers is problematic. If its share is too low, the layer obtained is too soft and does not have the desired resistance to etching when the base metal surface is being structured.

The $C_3$ to $C_{10}$ alkyl acrylates, more specifically butyl acrylate, are also used to optimize the rigidity of the copolymer, wherein these components proved to be antagonists to methyl and ethyl methacrylate. This component furthermore affects the glass transition temperature $T_g$ of the copolymer. This temperature should be the lowest possible in order to keep the temperature for heat treatment after laser ablation as low as possible. This is necessary to minimize thermal stress of the dielectric substrate and of possibly other electronic components that have already been placed on the circuit carriers to be processed. An increase in the share of $C_3$ to $C_{10}$ alkyl acrylates causes the $T_g$ value to drop. On the other hand, too high a proportion of butyl acrylate yields too soft a layer. As a result thereof, protection of the base metal surface against an aqueous chemical etchant is additionally improved.

By using the hydroxy alkyl methacrylates, the adhesion of the layer of varnish to the base metal surface is optimized. By increasing their concentration in the copolymer, adhesion is enhanced. The upper limit to the share is reached when the copolymer can no longer be completely removed from the base metal surface with an alkaline aqueous solution.

If the reaction occurring during the synthesis of the copolymers is adequately run, their properties can be optimized further. The previously mentioned properties are achieved in producing copolymers with a mean molecular weight $M_W$ of 25,000 to 100,000 g/mol, more specifically of 50,000 to 60,000 g/mol. If $M_W$ is too low, the copolymer obtained is again too soft and does not have the required resistance to etching. A varnish with a copolymer having too high a value for this parameter can no longer be readily and completely removed from the base metal surface.

The index of polydispersiveness $P_1$ of the copolymer, which is defined by the ratio $M_W/M_N$, $M_N$ being the mean number of the molecular weight of the copolymer, can also be optimized by the way the reaction occurring during the synthesis of the copolymers is run. In choosing a value of 2.5 to 3.5 for $P_1$, more specifically of 2.0 to 2.5, layers of varnish can be produced that make good resistance to etching possible.

This parameter is also an indicator for the action of the varnish containing the copolymer: the lower the value of $P_1$, the more the mixture of copolymers with various molecular weights obtained by synthesis is homogeneous, so that, if the value for $M_W$ is high enough, less parts of copolymers with a low value for $M_W$ are contained. Through the use of such copolymers, improved resistance to etching is made possible.

The mean weight of the molecular weight $M_W$ is for example determined by means of size exclusion chromatography (SEC), more specifically by means of gel permeation chromatography (GPC). The mean number of the molecular weight $M_N$ may for example be determined by osmometry. The two methods are actually known.

In addition to the copolymer, the varnish can contain at least one ablation intensifier matching the ultraviolet irradiation. The ablation intensifier more specifically is an aromatic carbonyl compound, e.g. derivatives of acetophenone, benzophenone or cinnamic acid. On principle, polycyclic hydrocarbons and polycyclic heterocycles are also suited. Besides acetophenone itself, trans-benzylidene acetophenone in particular may be contained as a derivative of acetophenone. Besides benzophenone itself, hydroxy benzophenones, dihydroxy benzophenones and polyhydroxy benzophenones may for example be utilized. The varnish can contain polycyclic hydrocarbons, among, others in the form of anthracene, 9-anthracene methanol, 1.4-dimethoxy anthracene, 9.10-diethyl anthracene, 9-phenoxy methyl anthracene, 9.10-bis(trimethylsilyl ethinyl) anthracene and pyrene and perytene as well, and polycyclic heterocycles, among others in the form of carbazole and its derivatives, more specifically with hydrophilic groups, e.g. phenolic hydroxy and carboxyl groups.

In that the varnish contains an ablation intensifier that matches the ultraviolet irradiation, a profitable ablation time is achieved. Comparative tests carried out with and without ablation intensifier yielded an enormous increase in the ablation speed of the layers of varnish: the irradiation time required to achieve complete removal could be reduced by a factor of at least 15, more specifically of 30 to 50 when these compounds were included. trans-benzylidene acetophenone is particularly well suited. The reason therefore possibly is that this compound is readily soluble in the copolymer particles so that the molecules of the ablation intensifier do not aggregate into larger sized bodies, these compounds being rather uniformly distributed in the matrix of the copolymer.

The ablation intensifier may be added to the varnish as an additional component in the usual way. In an alternative embodiment, a covalent bond can also be formed between the ablation intensifier and the skeleton of the copolymer. In this case, the required proximity in space of the sensitizer to the copolymer in the layer of varnish is already achieved by this bond.

By utilizing the special copolymer composition and more specifically in using the specific ablation intensifiers, an extremely fast removal of the applied layer of varnish by ultraviolet irradiation is made possible. This is achieved on one hand by having the varnish composition formulated in such a way that, although the thickness of the layer is small and amounts to no more than 5 $\mu$m, preferably to no more than 3 $\mu$m and more specifically to from 1 to 2 $\mu$m, the resistance to etching of the metal pattern areas coated with the layer of varnish in an acid etchant achieved for metal patterns made from copper is sufficient. In that the layer of varnish is capable of protecting so well the underlying layers of base metal against the etchants, the thickness of the layer of varnish can be chosen to be small so that the ablation rate can be considerably increased compared to known methods. By additionally inserting the compounds of the ablation intensifier, the ablation rate is additionally increased to the extent mentioned. As a result thereof, with ultraviolet irradiation, exposure times are achieved for removing the layer of varnish without leaving any residues that are considerably inferior to the processing times of the known methods.

The electrophoretic varnish may contain further customary components such as dyes and pigments for improving the working properties of the varnish and an optical inspection after structuring, then plasticizers and inorganic fillers that influence the flow properties (rheology) of the varnish for example, moreover bonding agents, e.g. benzotriazole or other similar compounds that may enhance the adhesion of the applied layer of varnish to the underlying copper film. In addition, the varnish may also contain surface lubricants for optimizing the working properties of the substrates coated with the layer of varnish as well as emulsifying agents, e.g. surface-active agents.

The substances mentioned are preferably dissolved or emulsified in an aqueous solvent. In addition to water, the solvent may also contain organic solvents, more specifically hydrophilic solvents such as methyl ethyl ketone, dioxan, methoxyethanol, diethylene glycol as well as ethylene glycol ester, e.g. ethylene glycol ester and diethylene glycol ethyl ester.

To produce the varnish, the above mentioned components may first be homogeneously dissolved in the organic solvent in a concentration of preferably 10 to 30 percent by weight. Then, the solution/emulsion thus obtained is added to water. Subsequently, at least one base is added to neutralize the acid groups of the copolymer, selected from the group comprising triethyl amine, monoethanolamine, morpholine, ammonia and sodium hydroxide. Other mono-, di- or trialkyl amines may also be used, e.g. tributyl amine. The pH of the emulsion is adjusted to a value ranging between neutral and slightly alkaline. The optimum pH depends on the type of the copolymer. In adding the base, the solubility/emulsifying power of the composition in water is improved so that an initially turbid emulsion in water turns into an almost clear solution. The solids content of the emulsion obtained preferably amounts to 5 to 20 percent by weight. The production process indicated herein above may also be changed.

The layer of varnish can be applied to the substrate by means of a customary method of electrophoresis. For this purpose, the substrate provided with the base metal surface is brought, together with a counter electrode, into contact with the varnish emulsion and a voltage is applied between the substrate and the counter electrode.

The layer thickness of the varnish preferably amounts to no more than 5 $\mu$m, more specifically to no more than 3 $\mu$m and more specifically to a preferred 1 to 2 $\mu$m. This makes certain of an extremely fast and dependable removal on ablating with ultraviolet irradiation.

Once the layer of varnish has been formed, the substrate is generally dried and posteriorly hardened by heat treating to solidify the layer, thus providing it with the required resistance to etching. For this purpose, the substrate is for example dried in a convection drier or with infrared heating by radiation. A combination of a continuous-flow drier and infrared heating by radiation or hot air path may also be made use of.

Then, the substrate is exposed to the radiative source in the way indicated. The thereby generated gaseous products are drawn by way of appropriate pumps from the immediate surroundings of the substrate in order to prevent a new layer from forming.

In using a very sharply focused laser beam from which leakage radiation surrounding the main beam is blanked out and which is scanned across the surface of the resist layer, extremely fine structures may be formed in the layer of resist. The structure widths that may be obtained are considerably lower than 20 $\mu$m. Alternatively, scattered laser irradiation, with a section of the beam of 5 cm by 5 cm, may also be used for example. In this case, the radiation is either directed onto the surface via a mask that is in direct contact with the surface of the substrate, or the radiation is projected onto the surface by way of an optical, system. The extremely fme structures with straight and steep flanks may be formed in these cases too.

After the layer of varnish has been structured by means of the ultraviolet irradiation, the base metal surfaces that have been laid bare are removed by etching. If the base metal surface of concern is a layer of copper, a customary acid etch solution for copper can be used for the purpose. A hydrochloric acid $CuCl_2$ etch solution or a hydrochloric acid $FeCl_3$ solution are particularly well suited.

After removal of the base metal layer that has been laid bare, the layer of varnish is preferably cleared off again so that the metal patterns are uncovered. Further layers of metal may thus be deposited onto the metal patterns. Aqueous alkaline solutions are particularly suited for the purpose, for example an aqueous solution of sodium carbonate or a solution of sodium hydroxide.

The thus obtained copper pattern is provided with sharply contoured, very fine copper structures that have steep and straight flanks.

After the metal patterns have been laid bare, at least one more layer of metal can be applied onto the metal patterns by means of a method of electroless plating. Appropriate layers of metal or combinations of metal layers are deposited in particular in order to protect the surfaces from corrosion and to form solderable and bondable surfaces or to preserve those during a long storage time. A layer of tin or of an alloy of tin can be deposited in order to form solderable surfaces; to obtain bondable surfaces, first a layer of nickel in particular and thereupon a layer of gold may be applied onto the copper surfaces.

In order to be capable of depositing the additional layers of metal, the copper surfaces of the metal patterns are first prepared in using for example solutions containing surface-active agents. Another additional possibility for preparing the surfaces consists in etching slightly the copper surfaces in order to create a microscopic roughness for example so that the further metallic layers adhere tightly to the copper surface. For this purpose, customary etch solutions for copper are employed, that is acid, aqueous solutions of oxidizing agents, e.g. solutions of alkali peroxo disulphate, hydrogen peroxide or caroate. Between these and further process stages, the surfaces are rinsed in order to completely remove rests of liquid still sticking on them from the previous treatment.

Then, in the copper regions that have been laid bare, a layer of tin or of a tin alloy for example serving as a solder layer or a layer of nickel and there upon a layer of gold serving as a bondable surface are formed by metal deposition. These layers also serve to protect the metal patterns against oxidation.

The plating baths used to form the metal layers by means of electroless plating are actually known.

After the coating steps mentioned have been carried out, the substrate is rinsed and dried.

The method mentioned herein above can be carried out by various techniques. The substrates provided with the copper films may for example be immersed into the processing solution contained in tanks. A preferred method for bringing the substrates into contact with the processing solutions consists in using a process of continuous horizontal operation for forming the layer of varnish and for removing the copper films that have been laid bare. This process consists in conveying the substrates through such a plant in horizontal direction of transportation. The substrates are thereby held either vertically or horizontally. In the first case, the substrates can again be conveyed in a horizontal direction of transportation. The solutions can be delivered to the surfaces of the substrate by means of appropriate nozzles in that they are brought into contact by means of flow nozzles, jet nozzles or spray nozzles or, in processing baths, with the processing fluids.

To produce highly integrated circuit carriers, the base material used for the substrates can consist of a dielectric that is provided on one or on both sides with base copper films. The production process of these materials is actually known. Depending upon the density of wiring needed, the layers of dielectric can be applied on one or on both sides of the carrier substrate. Multiple coatings are also conceivable, a circuit pattern being formed in each new layer by means of the method according to the invention. This permits to almost indefinitely increase the density of signal wiring. It is evident that the respective conductive pattern must be finished before an additional dielectric layer can be constituted.

FIG. 1 is a schematic illustration of the method according to the invention:

A layer of varnish 3 is applied by electrophoresis onto a substrate which is already provided with copper films 1 and which substantially consists of the copper films and of layers of epoxy resin 2.

According to FIG. 1A, the layer of varnish is partially covered with a mask 4, e.g. with a contact metal mask. Ultraviolet laser irradiation 5, emitted by a KrF-excimer laser for example, is radiated through the mask 4 onto the layer of varnish. In the exposed regions, the layer of varnish 3 is thereby removed from the surfaces of the copper films 1. This can be surveyed from FIG. 1B at the places 6 where the layer of varnish 3 has been partially removed.

Then, the exposed substrate is brought into contact with a chemical etch solution, a hydrochloric acid $CuCl_2$ solution for example. The copper surfaces that have been laid bare are attacked in the process so that the copper film 1 is removed from the epoxy resins in these regions. This may be surveyed from FIG. 1C at the places 6'. In the process of etching, the desired circuit pattern is created on the surfaces of epoxy resin 2.

Then, the remaining layer of varnish is cleared off with a stripping solution, with a NaOH solution for example. The metal pattern produced is left on the substrate (FIG. 1D).

Results of the assays for optimizing the method are indicated herein after:

Synthesis of the Copolymers:

1. At first, the copolymers were produced in batches:

To produce the copolymers, methyl ethyl ketone (MEK) and azobisiso butyro nitrile (AZDN) were given into a double-necked flask. Then, the monomers were added. The reaction mixture was kept hermetically sealed during the entire duration of the reaction. The proportion of ingredients utilized for producing the copolymers is indicated in Table 1.

To initiate the polymerization reaction, the mixture was heated. The mixture was kept at recycling for 24 hours, the conversion in [%] determined upon completion of the reaction is also indicated in Table 1.

Upon completion of the reaction, the polymer was precipitated from the reaction mixture with water in a ratio of weight of 7 parts of water to 1 parts of reaction mixture. After separation, a colorless powder was obtained that was dried under vacuum for 48 hours at 60 to 70° C.

The molecular weights of the copolymers were determined by means of gel permeation chromatography ($M_W$) or osmometry ($M_N$), a PMMA standard being used each time for calibration.

2. In further assays, synthesis of copolymers was carried out by a semi-continuous process. For this purpose, only part of the individual reactants were added at the beginning of the reaction, the rest of them were added at a later stage.

BA or BMA resp. were added in a batch to the reaction mixture, i.e. the whole amount at the beginning of the reaction. The initiator AZDN was also added in a batch for the copolymer No. 6. One part of MAA, MMA and HEMA respectively was added at the beginning of the reaction and another part (approximately 33 to 39% referred to the whole amount of this monomer) was added within 9 hours of reaction time.

The proportion of ingredients of the monomers and the properties of the copolymers made from these monomers are indicated in Table 2. The values of the added proportions of monomers indicated in brackets are the amounts added within 9 h of reaction time whereas the other values are the amounts added at the beginning of the reaction. For AZDN, the different additions were indicated separately, the instant of time of the addition has been given in brackets (for example T3h: addition after 3 hours).

Characterization of the Varnishes and the Layers of Varnish:

Some of the copolymers that were produced in batches or according to the semi-continuous method were applied onto a copper plate by spin-coating, different rotational speeds having been set according to the desired thickness of the layer. The layers were dried in an oven at 70° C. or 100° C. resp.—depending on the $T_g$ value of the copolymer. The oven was equipped with a fan.

Thickness, resistance to etching and capacity of removal in alkaline aqueous solution were determined. The conditions under which this was determined were as follows:

a) Thickness of the layer: to determine the layer thickness, a device was used by means of which induced currents or eddy currents are measured (Bykotester 7500).

The repeatability of the values measured amounted to ±1 μm. The values obtained were verified by optical microscopy.

b) Resistance to etching: etch solution: 30 percent by weight $FeCl_3$ solution +10 percent by weight HCl+60 percent by weight water
Temperature: 40° C., immersion time: 1 min c) Capacity of removal in alkaline solution: 2 percent by weight NaOH solution
Temperature: 50° C., immersion time: 1 min The results are reproduced in Table 3.

3. Further copolymers were produced to test reproducibility of the production process. The ratio of mixture of the monomers and the physical properties of the copolymers obtained from the monomers are indicated in Table 4.

Copolymer No. 13 was produced under the same conditions than copolymer No. 6. But here, the conversion achieved was higher so that the glass transition temperature was lower.

The copolymers No. 14 and 15 were polymerized within 6 h instead of 9 h. Therefore, the conversions are not the same.

In order to increase reproducibility, the copolymers No. 16 and 20 were polymerized, semicontinuously adding the monomers and the initiator. The conversions achieved were the same.

Copolymer No. 17 was produced under the same conditions but with a higher proportion of BA. It was observed that the glass transition temperature was lower (approximately 74° C.).

Further results with regard to the resistance to etching are indicated in Table 5. It may be deduced therefrom that, with the copolymers No. 16 and 17, etch resistant layers of 3 μm thick are obtained. These layers may also be completely removed from the copper areas in the alkaline aqueous solution within the indicated immersion time.

Furthermore, it was investigated how the copolymers produced are suited to formulate an anaphoretic varnish. For this purpose, varnishes were produced that had the following formulation:

| | |
|---|---|
| polymer | 10 percent by weight |
| solvent (MEK) | 18.6 percent by weight |
| base (triethyl amine) | 0.4 to 1.2 percent by weight |
| water | the rest |

In that the amount of the added base was varied, different pH of the varnishes were adjusted. Different conditions of the emulsion formed were obtained thereby: when the pH of the varnish was below a certain transition point, the fluid obtained was turbid. Above this value, the emulsion was clear. At the transition point itself, the turbid fluid turned into a clear emulsion.

Figure 2:
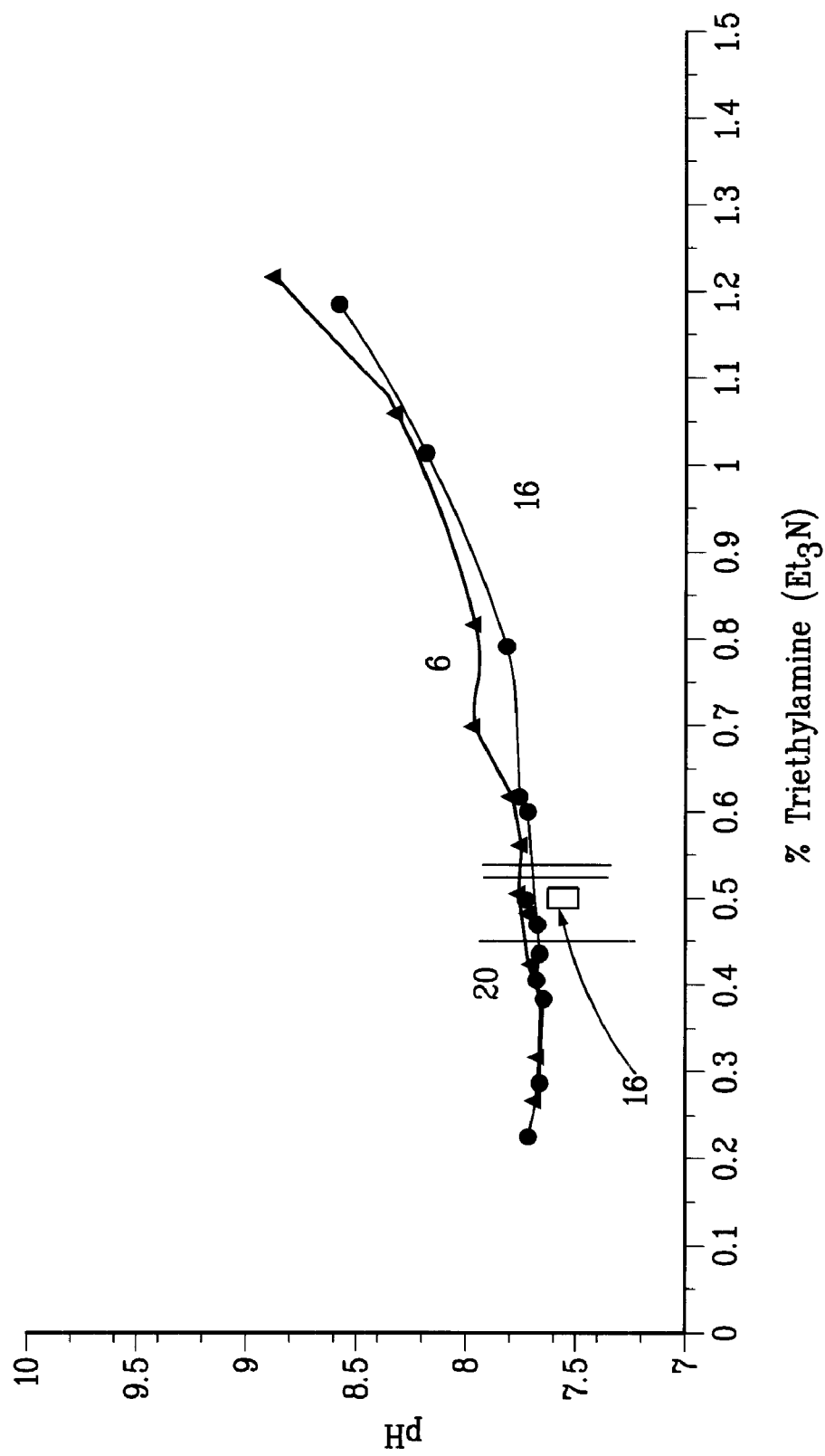
FIG. 2 shows the dependence of the pH on the amount of triethyl amine (in percent by weight) added to the varnish.

Varnishes were produced with the copolymers No. 6, 16 and 20 and they were examined. FIG. 2 shows the dependence of the pH on the amount of triethyl amine [percent by weight] added to the varnish. It can furthermore be seen from FIG. 2 at which pH the fluid was turbid and at which pH a clear emulsion was obtained.

To form an anaphoretic varnish, a pH at which the emulsion was clear was respectively adjusted slightly above the transition point hinted at with vertical lines in FIG. 2.

To deposit the varnish by anaphoresis an experimental array was chosen in which a copper plate serving as an anode and with an overall area of 6 $cm^2$ was arranged between two plates of special steel serving as cathodes. The spacing anode/cathode was set to 2 cm. This array was arranged in a tank containing the emulsion. The volume of the fluid amounted to 100 $Cm^3$. By means of a power supply, a voltage was applied between the anode and the cathodes, the flowing current being kept constant.

Figure 3:
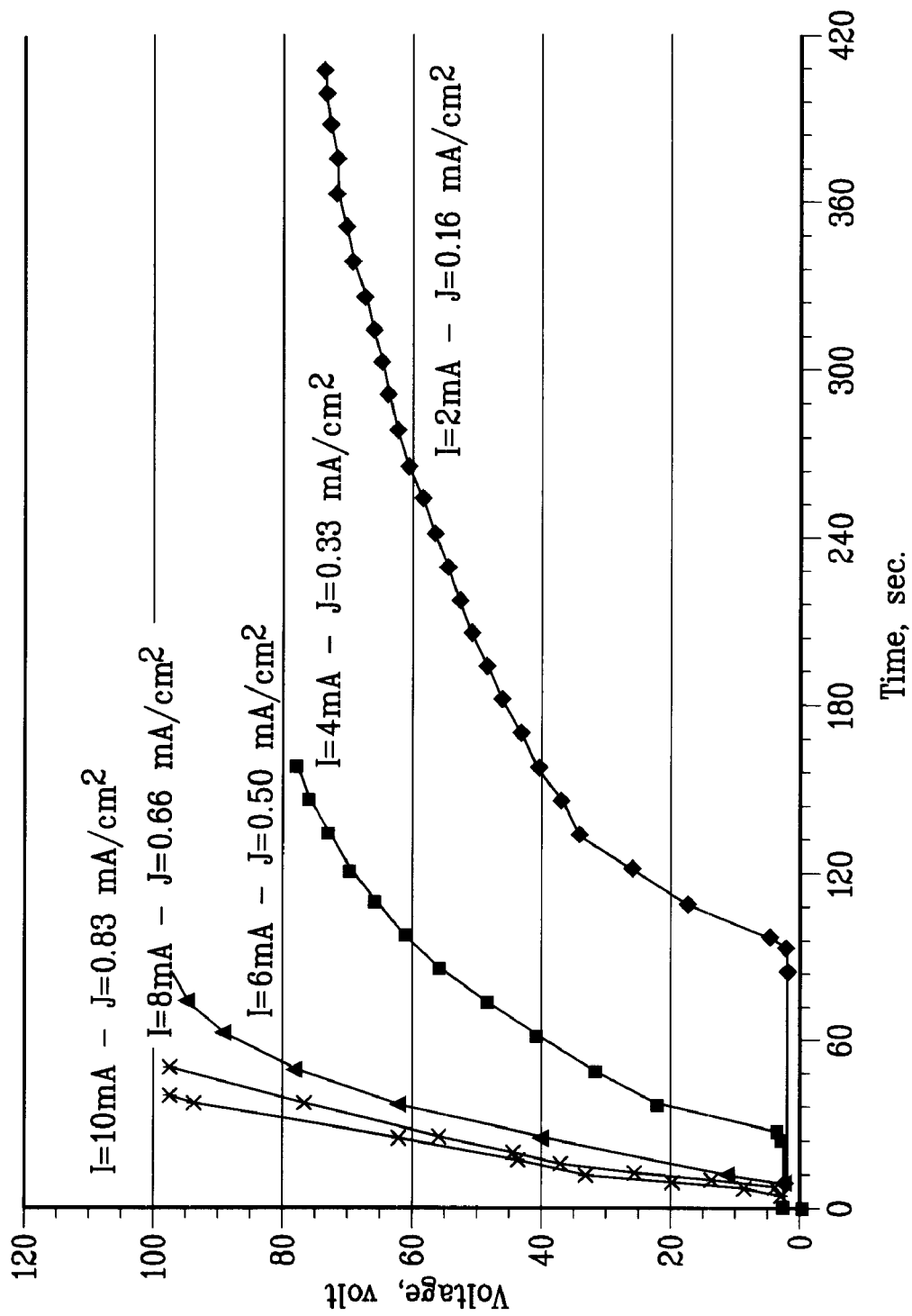
FIG. 3 shows, for different cathodic current densities, typical voltage/time dependencies for a varnish produced with the copolymer No. 6.

FIG. 3 shows, for different cathodic current densities, typical voltage/time dependencies for a varnish produced with the copolymer No. 6. It has been found that the varnish produced with the copolymer No. 16 exhibits a similar behavior.

By adjusting the cathodic current density, layers of the varnish produced with the copolymer No. 6 could be produced in a wide range of different thicknesses. In that the duration of deposition was selected at a set cathodic current density, layers of a determined thickness could be obtained.

Upon deposition of the layers of varnish made from the copolymer No. 6 onto the copper anode, said copper anode was rinsed and dried in order to remove excess amounts of the solvent (MEK) and of the base (triethyl amine) from the layer and to condense the layer.

Figure 4:
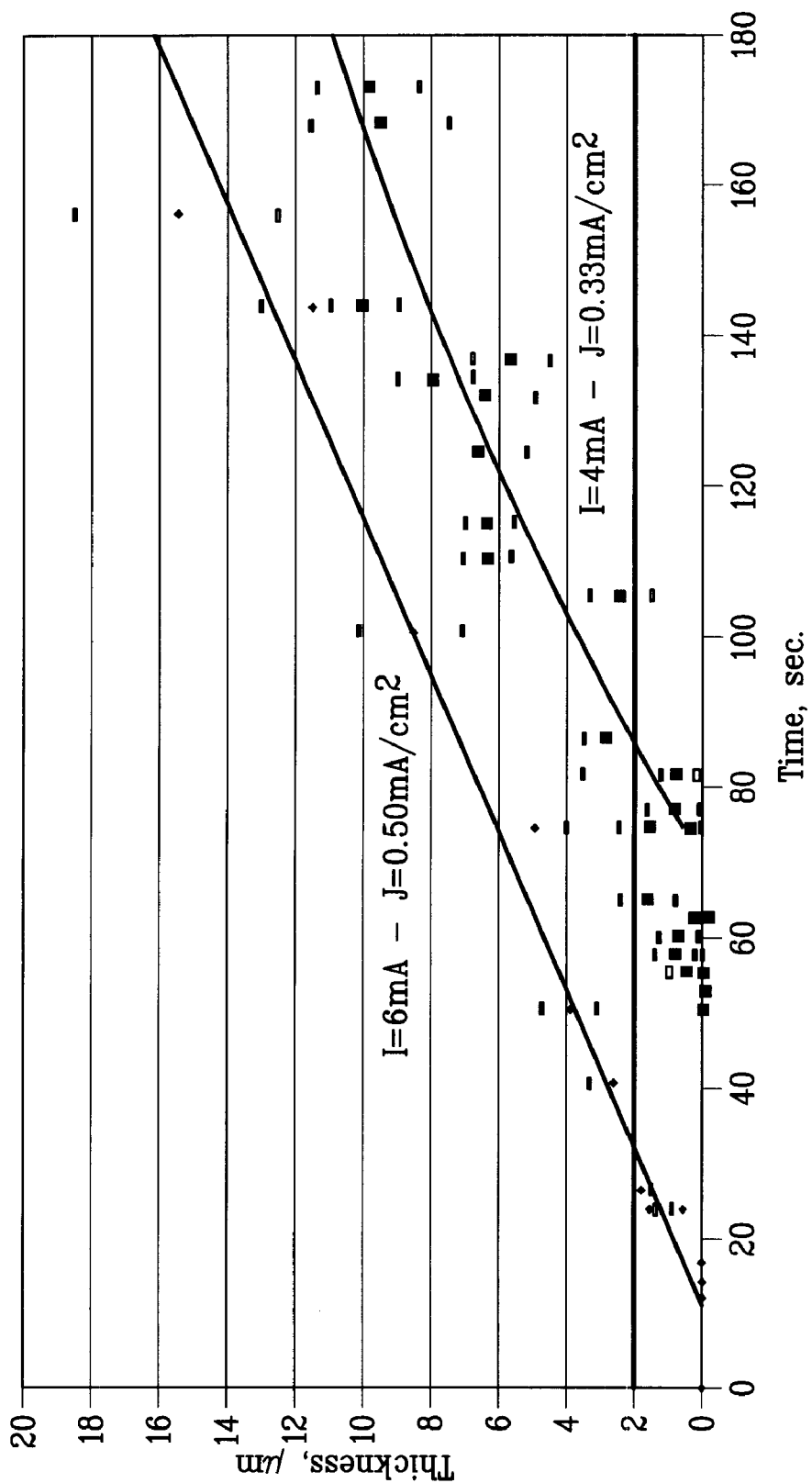
FIG. 4 shows the results of the measurement of the layer thickness for varnishes that were obtained with the copolymer No. 6, the layers having been produced in this case with two different cathodic current densities.

FIG. 4 shows the results of the measurement of the layer thickness for varnishes that were obtained with the copolymer No. 6, the layers having been produced in this case with two different cathodic current densities.

After production, the layers were treated by heating at 95° C. for 30 min. The temperature was 10° C. above the glass transition temperature of this copolymer.

It may be seen from FIG. 4 that layers of a thickness of merely 1 to 2 μm could be obtained.

The resistance to etching of these layers was determined in further tests. The resistance to etching was tested with a solution the composition of which was as follows:

| | |
|---|---|
| FeCl$_3$ | 30 percent by weight |
| HCl | 10 percent by weight |
| water | the rest |

The temperature of the etching bath amounted to 40° C., the etching time to 1 min.

Table 6 indicates the results for varnishes with the copolymer No. 6, the layer of varnish having in this case been deposited with a cathodic current density of j=0.50 mA/cm$^2$.

Table 6 indicates, in addition to the copolymers required for the formulation of the varnish, the cut-off voltage (voltage at which the deposition was terminated), the duration of the deposition, the determined layer thickness and the resistance to etching.

Table 7 contains further results for the resistance to etching of various varnishes with the copolymer No. 6 that were obtained at a cathodic current density of j=0.33 mA/cm$^2$.

Tables 6 and 7 show that the minimum thickness of the layer of varnish with the copolymer No. 6 amounted to 2 to 3 μm, the anodic current density did not matter. This minimum thickness of the layer corresponded to the minimum layer thickness of the layers applied by spin-coating. Tests made with a varnish that had been produced with the copolymer No. 16 yielded the same result.

Moreover, the layers that had been deposited by anaphoresis were examined by means of scanning electron microscopy (SEM) and atomic force microscopy (AFM). The surfaces of the layers were found to be rougher than the corresponding layer surfaces of the layers produced by spin-coating. The mean roughness of a layer of 2.9 μm thick determined by means of the AFM-technique amounted to 320 nm, whereas the mean roughness of a layer of 3.4 μm thick applied by the spin-coating technique amounted to 70 nm. The layers, produced by anaphoresis were substantially of a column-shaped structure.

Then, tests were carried out to include an ablation intensifier in the varnish composition of the copolymer No. 16. The ablation intensifier used was trans-benzylidene acetophenone in a concentration of 10 percent by weight referred to the amount of copolymer. The inclusion of the ablation intensifier did not substantially influence the emulsifying behavior of the copolymer. The pH was only increased by approximately 0.15 units. The characteristic curve remained substantially unchanged.

The following anaphoresis experiments were carried out with a varnish of the following composition:

| | |
|---|---|
| copolymer No. 16 | 10 percent by weight |
| trans-benzylidene acetophenone | 1 percent by weight |
| MEK | 18.6 percent by weight |
| triethyl amine | 0.5 percent by weight |
| water | 69.9 percent by weight |

The pH of the emulsion was 7.84.

Layers of a thickness of 3.8 μm and 11.5 μm were deposited under the conditions mentioned herein above.

Ablation was then examined with an ultraviolet laser source on a plate of epoxy resin that was provided with a copper film of 10 μm thick and with a layer of varnish of 3 μm thick applied thereon. For this purpose, a KrF laser with an output of 50 watt was employed. The focused laser beam was scanned across the coated surface. The energy density in the laser beam amounted to from 150 mJ/cm$^2$ to 200 mJ/cm$^2$. The layer of varnish was thereby removed from the copper film.

The copper laid bare in the process of laser structuring was removed at 45° C. with an acid copper chloride etch solution of the following composition:

| | |
|---|---|
| copper chloride | 80 to 160 g Cu$^{2+}$/l |
| hydrochloric acid | 280 to 300 ml (HCl at 32 percent by weight)/l |

A pattern consisting of copper circuit lines was formed. Subsequently, the layer of varnish was completely removed from the base copper surface with a 2 percent by weight solution of NaOH.

Images were formed by a scanning electron microscope by means of which the etch result was verified: the circuit lines had a very regular section: the circuit lines were trapezoid in shape and had a width of approximately 20 μm. The area of the circuit lines resting on the FR4 material was larger than the surface of the circuit lines. The flanks of the circuit lines were regular, straight and so steep that the undercut amounted to less than 2.5 μm. No notches, funnel-shaped etchings and other irregularities were observed. No etching tracks could be seen on the surface regions that were protected by the layer of varnish during the etching process.

To determine the effect of the ablation intensifier, a layer of varnish was applied over the whole surface of printed circuit board material by means of spin-coating, said layer had a thickness of 2.5 μm and contained the ablation intensifier in a concentration of 10 percent by weight. Various regions of a layer thus produced were exposed to a varying number of laser pulses with a laser wavelength of 308 nm, a laser energy of 600 mJ and an energy density of 400 mJ/cm$^2$. Then, the copper that had been laid bare was etched. This allowed to determine how many laser pulses were needed to completely remove the polymer. Table 8 reproduces the results of these tests.

TABLE 1

| Monomer | copolymer No. 1 Content [percent by weight] | copolymer No. 2 Content [percent by weight] | copolymer No. 3 Content [percent by weight] | copolymer No. 4 Content [percent by weight] | copolymer No. 5 Content [percent by weight] |
|---|---|---|---|---|---|
| MAA | 12.5 | 12.5 | 12.5 | 12.5 | 12.5 |
| MMA | 51.8 | 51.8 | 60.9 | 12.5 | 34.1 |
| BA | 28.5 | 28.5 | 19.4 | | |
| BMA | | | | 67.8 | 46.2 |
| HEMA | 7.2 | 7.2 | 7.2 | 7.2 | 7.2 |

TABLE 1-continued

| Monomer | copolymer No. 1 Content [percent by weight] | copolymer No. 2 Content [percent by weight] | copolymer No. 3 Content [percent by weight] | copolymer No. 4 Content [percent by weight] | copolymer No. 5 Content [percent by weight] |
| --- | --- | --- | --- | --- | --- |
| AZDN | 0.48 | 0.48 | 0.48 | 0.48 | 0.48 |
| Conversion [%] | 94.80 | 94.80 | 92.40 | 93.60 | 92.80 |
| $T_g$ [° C.], estimated | 50 | 50 | 70 | 50 | 70 |
| $T_g$ [° C.], measured*) | 81.2 | 81.5 | 99.9 | 83.1 | 89.3 |
| $T_g$ [° C.], measured**) | 68.7 | | 63 | | |
| $M_N$ [g/mol] | | 23,450 | 24,430 | 25,450 | 25,200 |
| $M_W$ [g/mol] | | 56,320 | 55,960 | 57,700 | 53,460 |
| $P_I$ | | 2.4 | 2.3 | 2.2 | 2.1 |

MAA: methacrylic acid
BMA: n-butyl methacrylate
BA: n-butyl acrylate
HEMA: 2-hydroxy ethyl methacrylate
MMA: methyl methacrylate
*) precipitated copolymer
**) dried copolymer from the solution

TABLE 2

| monomer | copolymer No. 6 Content [percent by weight] | copolymer No. 7 Content [percent by weight] | copolymer No. 9 Content [percent by weight] | copolymer No. 10 Content [percent by weight] | copolymer No. 11 Content [percent by weight] |
| --- | --- | --- | --- | --- | --- |
| MAA | 12.5 (39.7) | 12.5 (39.7) | 12.5 (40.1) | 12.5 (39.8) | 12.5 (59.9) |
| MMA | 60.9 (39.2) | 51.8 (39.2) | 45.3 (69.7) | 12.5 (40.1) | 45.3 (59.9) |
| BA | 19.4 | 28.5 | 35 | | 35 |
| BMA | | | | 67.8 | |
| HEMA | 7.2 (33.1) | 7.2 (33.1) | 7.2 (39.8) | 7.2 (40.1) | 7.2 (81.5) |
| AZDN | 0.48 | 0.48 (T0 + 0.24 (T4h) | 0.3 (T0) + 0.2 (T3h) + 0.2 (T6h) | 0.3 (T0) + 0.2 (T3h) + 0.2 (T6h) | 0.3 (T0) + 0.2 (T3h) + 0.2 (T6h) |
| Conversion [%] | 82.80 | 94.90 | 99.70 | 97.20 | |
| $T_g$ [° C.], estimated | 70 | 50 | <50 | 50 | <50 |
| $T_g$ [° C.], measured*) | 86 | 67.9 | 73 | 62 | 73.7 |
| $T_g$ [° C.], measured**) | 55 | | 62.4 | 56 | 55.3 |
| $M_N$ [g/mol] | 25,410 | 11,680 | 13,640 | 16,640 | 11,630 |
| $M_W$ [g/mol] | 56,680 | 43,320 | 43,980 | 45,800 | 37,180 |
| $P_I$ | 2.23 | 3.71 | 3.22 | 2.75 | 3.2 |

MAA: methacrylic acid
BMA: n-butyl methacrylate
BA: n-butyl acrylate
HEMA: 2-hydroxy ethyl methacrylate
MMA: methyl methacrylate
*) precipitated copolymer
**) dried copolymer from the solution

TABLE 3

| copolymer No. | Thickness [µ] | Resistance to etching *) | Capacity of removal |
| --- | --- | --- | --- |
| 3 | 9.3 | ok. | ok. |
| 3 | 6.1 | ok. | ok. |
| 6 | 6.4 | ok. | ok. |
| 6 | 5.4 | ok. | ok. |
| 9 | 10 | oxidation | ok. |
| 9 | 10 | oxidation | ok. |
| 10 | 5 | oxidation | not possible |
| 10 | 4.4 | oxidation | not possible |
| 11 | 7.4 | Slight oxidation | — |
| 11 | 4.6 | Slight oxidation | — |

*)"ok.": in order, all right (for resistance to etching: no oxidation to be seen)

TABLE 5

| copolymer No. | Thickness [µ] | Resistance to etching *) | Capacity of removal |
| --- | --- | --- | --- |
| 16 | 5.28 | ok. | ok. |
| 16 | 4.04 | ok. | ok. |
| 16 | 3 | ok. | ok. |
| 17 | 5.36 | ok. | ok. |
| 17 | 4.04 | ok. | ok. |
| 17 | 3 | ok. | ok. |

*)"ok.": in order, all right (for resistance to etching: no oxidation to be seen)

TABLE 4

| monomer | copolymer No. 13 Content [percent by weight] | copolymer No. 14 Content [percent by weight] | copolymer No. 15 Content [percent by weight] | copolymer No. 16 Content [percent by weight] | copolymer No. 17 Content [percent by weight] | copolymer No. 20 Content [percent by weight] |
|---|---|---|---|---|---|---|
| MAA | 12.5 (39.7) | 12.5 (39.7) | 12.5 (39.7) | 12.5 (39.7) | 12.5 (39.7) | 12.5 (39.7) |
| MMA | 60.9 (39.2) | 60.9 (39.2) | 60.9 (39.2) | 60.9 (39.2) | 51.8 (39.2) | 60.9 (39.2) |
| BA | 19.4 | 19.4 | 19.4 | 19.4 | 19.4 | 19.4 |
| HEMA | 7.2 (33.1) | 7.2 (33.1) | 7.2 (33.1) | 7.2 (33.1) | 7.2 (33.1) | 7.2 (33.1) |
| AZDN | 0.48 | 0.48 | 0.48 | 0.48 (semi-cont. 6 h) | 0.48 (semi-cont. 6 h) | 0.48 (semi-cont. 6 h) |
| Semicont. for monomeres | 9 h | 6 h | 6 h | 6 h | 6 h | 6 h |
| Conversion [%] | 92.3 | 89.1 | 94.4 | 92.1 | 88.6 | 92.5 |
| $T_g$ [° C.] measured*) | 81 | 93 | 92 | 92.5 | 74 | |
| $T_g$ [° C.] measured**) | 67 | 50.7 | 85.5 | 68 | 68 | |
| $M_N$ [g/mol] | 15,130 | 24,400 | 25,570 | 24,520 | 22,120 | |
| $M_W$ [g/mol] | 38,470 | 54,200 | 69,410 | 55,240 | 52,400 | |
| $P_I$ | 2.5 | 2.2 | 2.71 | 2.25 | 2.37 | |

MAA: methacrylic acid
BMA: n-butyl methacrylate
BA: n-butyl acrylate
HEMA: 2-hydroxy ethyl methacrylate
MMA: methyl methacrylate
*) precipitated copolymer
**) dried copolymer from the solution

TABLE 6

| Sample No. | Cut-off voltage [V] | Deposition time [Sec] | Film thickness [μm] | Resistance to etching |
|---|---|---|---|---|
| 13 | 2.6 | 12 | 0 | poor |
| 4 | 9.5 | 14.4 | 0 | poor |
| 14 | 9.0 | 16.8 | 0 | poor |
| 5 | 19.0 | 24 | 0.7 | poor |
| 6 | 28.6 | 24 | 1.55 | satisfactory |
| 7 | 38.1 | 26.4 | 1.9 | satisfactory |
| 8 | 47.6 | 40.8 | 2.65 | good |
| 9 | 57.1 | 50.4 | 4 | good |
| 10 | 66.6 | 74.4 | 5 | good |
| 11 | 71.4 | 100.8 | 8.6 | good |
| 12 | 71.9 | 144 | 11.5 | good |

TABLE 7

| Sample No. | Cut-off voltage [V] | Deposition time [Sec] | Film thickness [μm] | Resistance to etching |
|---|---|---|---|---|
| 16 | 19.0 | 50.4 | 0 | poor |
| 12 | 39.1 | 55.2 | 0.5 | poor |
| 9 | 52.4 | 57.6 | 0.8 | poor |
| 10 | 47.6 | 60 | 0.8 | poor |
| 6 | 66.6 | 64.8 | 1.7 | poor |
| 4 | 76.2 | 74.4 | 2 | satisfactory |
| 5 | 71.4 | 74.4 | 1.6 | satisfactory |
| 2 | 80.9 | 86.4 | 2.9 | good |
| 21 | 117.6 | 105.6 | 2.5 | good |
| 22 | 114.2 | 110.4 | 6.4 | good |
| 24 | 106.0 | 115.2 | 6.4 | good |
| 23 | 110.0 | 124.8 | 6.6 | good |
| 27 | 118.0 | 134 | 7.9 | good |

TABLE 8

| copolymer No. | Ablation intensifier | result |
|---|---|---|
| 9 | benzylidene acetophenone | 7 pulses |
| 9 | 2.4-dihydroxy benzophenone | 7 pulses |
| 10 | trans-stilbene | >90 pulses, no ablation |
| 10 | benzylidene acetophenone | 6 pulses |
| 10 | 2.4-dihydroxy benzophenone | 6 pulses |
| 9 | without | >90 pulses, no ablation |

What is claimed is:

1. Method of forming a metal pattern on a dielectric substrate involving the following steps:
   a) providing a substrate provided with a base metal surface;
   b) applying a layer of varnish to the substrate by means of an electrophoretic process, wherein the layer of varnish is formed with at least one acrylic copolymer;
   c) ablating the layer of varnish in at least parts of the regions that do not correspond to the metal pattern to be formed, the base metal surface being laid bare;
   d) etching of the base metal surface that has been laid bare, wherein the layer of varnish is ablated by means of ultraviolet irradiation.

2. Method according to claim 1, wherein the ultraviolet irradiation is generated by a laser.

3. Method according to one of the previous claims 1–2, wherein the ultraviolet irradiation is generated by an excimer laser.

4. Method according to one of the previous claims 1–2, wherein the layer of varnish is formed by an anaphoretic varnish.

5. Method according to one of the previous claims 1–2, wherein the varnish is formed with at least one copolymer produced by the copolymerization of monomers, selected from the group comprising methacrylic acid, $C_1$ to $C_2$ alkyl methacrylate, $C_3$ to $C_{10}$ alkyl (meth)acrylate and hydroxy alkyl methacrylate the alkyl groups of which have two to four atoms of carbon.

6. Method according to claim 5, wherein, to form the copolymer, methyl methacrylate is used as said $C_1$ to $C_2$ alkyl methacrylate, butyl acrylate as said $C_3$ to $C_{10}$ alkyl (meth)acrylate and 1-hydroxy ethyl methacrylate or 2-hydroxy ethyl methacrylate as said hydroxy alkyl methacrylate.

7. Method according to claim 5, wherein the copolymer is formed from monomers with the following amounts:
   a) methacrylic acid: 1 to 25 percent by weight
   b) $C_1$ to $C_2$ alkyl methacrylate: 20 to 80 percent by weight
   c) $C_3$ to $C_{10}$ alkyl acrylate: 1 to 50 percent by weight
   d) hydroxy alkyl methacrylate: 0 to 20 percent by weight, the sum of the afore mentioned monomers amounting to a total of 100 percent by weight.

8. Method according to claim 5, wherein a mean weight of the molecular weight $M_W$ of 25,000 to 100,000 g/mol is adjusted for the copolymer.

9. Method according to claim 8, wherein the value of $M_W$ is set in the range of 50,000 to 60,000 g/mol.

10. Method according to claim 5, wherein the index of polydispersiveness $P_1$ for the copolymer is adjusted to a value of 1.5 to 3.5.

11. Method according to claim 10, wherein the value of $P_1$ ranges from 2.0 to 2.5.

12. Method according to one of the previous claims 1–2, wherein the varnish contains at least one ablation intensifier adjusted to the ultraviolet irradiation.

13. Method according to claim 12, wherein the at least one ablation intensifier is selected from the group comprising aromatic carbonyl compounds, polycyclic hydrocarbon compounds and polycyclic heterocycles.

14. Method according to one of the claims 12, wherein derivatives of acetophenone, benzophenone or cinnamic acid are used as said ablation intensifier.

15. Method according to one of the previous claims 1–2, wherein the varnish is anaphoretic and contains at least one base selected from the group comprising mono, di, trialkyl amines, monoethanol amine, morpholine, ammonia and sodium hydroxide.

16. Method according to one of the previous claims 1–2, wherein the base metal surface that has been laid bare is removed with an acid etch solution.

17. Method according to one of the previous claims 1–2, wherein the layer of varnish is cleared off again with an aqueous, alkaline solution after removal of the base metal surface that has been laid bare.

18. Method according to claim 17, wherein at least one further metal layer is applied onto the metal pattern by means of electroless plating.

19. Method according to claim 18, wherein a layer of nickel is deposited first, and thereupon a layer of gold is applied.

20. Method according to one of the previous claims 1–2, wherein the metal pattern is formed on substrates coated with a copper film.

21. Method according to one of the claims 1 to 2, wherein the process steps b) to d) are carried out by a horizontal continuous method.

22. Method according to one of the claims 1–2, wherein the method is applied to form products selected from the group consisting of highly integrated circuit carriers, chip carriers, multi chip modules, hybrid circuit carriers, printed circuit boards, and high density interconnects.

23. Method according to one of the claims 1–2, wherein the layer of varnish is less than 5 µm thick.

24. Method of forming a metal pattern on a dielectric substrate involving the following steps:

a) providing a substrate provided with a base metal surface;

b) applying a layer of varnish to the substrate by means of an electrophoretic process, wherein the layer of varnish is formed by an anaphoretic varnish;

c) ablating the layer of varnish in at least parts of the regions that do not correspond to the metal pattern to be formed, the base metal surface being laid bare;

d) etching of the base metal surface that has been laid bare, wherein the layer of varnish is ablated by means of ultraviolet irradiation.

25. Method according to one of the claims 24, wherein the varnish is formed with at least one copolymer produced by the copolymerization of monomers, selected from the group comprising methacrylic acid, $C_1$ to $C_2$ alkyl methacrylate, $C_3$ to $C_{10}$ alkyl (meth)acrylate and hydroxy alkyl methacrylate the alkyl groups of which have two to four atoms of carbon.

26. Method according to claim 25, wherein, to form the copolymer, methyl methacrylate is used as said $C_1$ to $C_2$ alkyl methacrylate, butyl acrylate as said $C_3$ to $C_{10}$ alkyl (meth)acrylate and 1-hydroxy ethyl methacrylate or 2-hydroxy ethyl methacrylate as said hydroxy alkyl methacrylate.

27. Method according to claim 25, wherein the copolymer is formed from monomers with the following amounts:
   a) methacrylic acid: 1 to 25 percent by weight
   b) $C_1$ to $C_2$ alkyl methacrylate: 20 to 80 percent by weight
   c) $C_3$ to $C_{10}$ alkyl acrylate: 1 to 50 percent by weight
   d) hydroxy alkyl methacrylate: 0 to 20 percent by weight, the sum of the afore mentioned monomers amounting to a total of 100 percent by weight.

28. Method according to claim 25, wherein a mean weight of the molecular weight $M_W$ of 25,000 to 100,000 g/mol is adjusted for the copolymer.

29. Method according to claim 28, wherein the value of $M_W$ is set in the range of 50,000 to 60,000 g/mol.

30. Method according to claim 25, wherein the index of polydispersiveness $P_1$ for the copolymer is adjusted to a value of 1.5 to 3.5.

31. Method according to claim 30, wherein the value of $P_1$ ranges from 2.0 to 2.5.

32. Method according to claim 24, wherein the varnish contains at least one ablation intensifier adjusted to the ultraviolet irradiation.

33. Method according to claim 32, wherein the at least one ablation intensifier is selected from the group comprising aromatic carbonyl compounds, polycyclic hydrocarbon compounds and polycyclic heterocycles.

34. Method according to claim 32, wherein derivatives of acetophenone, benzophenone or cinnamic acid are used as said ablation intensifier.

35. Method of forming a metal pattern on a dielectric substrate involving the following steps:

a) providing a substrate provided with a base metal surface;

b) applying a layer of varnish to the substrate by means of an electrophoretic process, wherein the varnish contains at least one ablation intensifier adjusted to the ultraviolet irradiation;

c) ablating the layer of varnish in at least parts of the regions that do not correspond to the metal pattern to be formed, the base metal surface being laid bare;

d) etching of the base metal surface that has been laid bare, wherein the layer of varnish is ablated by means of ultraviolet irradiation.

36. Method according to claim 35, wherein the at least one ablation intensifier is selected from the group comprising aromatic carbonyl compounds, polycyclic hydrocarbon compounds and polycyclic heterocycles.

37. Method according to claim 35, wherein derivatives of acetophenone, benzophenone or cinnamic acid are used as said ablation intensifier.

* * * * *